(12) United States Patent
Cao et al.

(10) Patent No.: US 10,895,810 B2
(45) Date of Patent: Jan. 19, 2021

(54) AUTOMATIC SELECTION OF SAMPLE VALUES FOR OPTICAL METROLOGY

(71) Applicants: Meng Cao, Union City, CA (US); Leonid Poslavsky, Belmont, CA (US); Inkyo Kim, Cupertino, CA (US); Lie-Quan Lee, Fremont, CA (US)

(72) Inventors: Meng Cao, Union City, CA (US); Leonid Poslavsky, Belmont, CA (US); Inkyo Kim, Cupertino, CA (US); Lie-Quan Lee, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 888 days.

(21) Appl. No.: 14/542,546

(22) Filed: Nov. 15, 2014

(65) Prior Publication Data
US 2015/0142395 A1    May 21, 2015

Related U.S. Application Data

(60) Provisional application No. 61/904,625, filed on Nov. 15, 2013.

(51) Int. Cl.
*G06F 3/00* (2006.01)
*G03F 7/20* (2006.01)
*G01B 11/24* (2006.01)
*G01B 11/02* (2006.01)
*G01B 11/06* (2006.01)
*G01N 21/21* (2006.01)

(52) U.S. Cl.
CPC .......... *G03F 7/70625* (2013.01); *G01B 11/02* (2013.01); *G01B 11/0625* (2013.01); *G01B 11/0641* (2013.01); *G01B 11/24* (2013.01); *G01N 21/211* (2013.01); *G01B 2210/56* (2013.01)

(58) Field of Classification Search
CPC ........................................................ G06F 17/50
USPC ............................................................. 703/1
See application file for complete search history.

(56) References Cited

U.S. PATENT DOCUMENTS

| | | | |
|---|---|---|---|
| 5,901,252 A | * | 5/1999 | Kawakami ........... G06K 9/4619 345/648 |
| 6,278,519 B1 | | 8/2001 | Rosencwaig et al. |
| 6,734,967 B1 | | 5/2004 | Piwonka-Corle et al. |
| 7,031,848 B2 | | 4/2006 | Opsal et al. |

(Continued)

OTHER PUBLICATIONS

Nien Fan Zhang, Use of Bayesian statistics to improve optical measurement uncertainty by combined multi-tool metrology. (Year: 2011).*

*Primary Examiner* — Lechi Truong
(74) *Attorney, Agent, or Firm* — Womble Bond Dickinson (US) LLP

(57) ABSTRACT

Embodiments include automatic selection of sample values for optical metrology. An embodiment of a method includes providing a library parameter space for modeling of a diffracting structure using an optical metrology system; automatically determining by a processing unit a reduced sampling set from the library parameter space, wherein the reduced space is based on one or both of the following recommending a sampling shape based on an expected sample space usage, or recommending a sampling filter based on correlation between two or more parameters of the library parameter space; and generating a library for the optical metrology system using the reduced sampling set.

24 Claims, 13 Drawing Sheets

(56) References Cited

U.S. PATENT DOCUMENTS

| | | | |
|---|---|---|---|
| 7,428,060 B2 | 9/2008 | Jin et al. | |
| 7,831,528 B2 | 11/2010 | Doddi et al. | |
| 8,856,694 B2 * | 10/2014 | Ye | B29C 64/393 |
| | | | 716/54 |
| 9,625,937 B2 * | 4/2017 | Bischoff | G06E 1/00 |
| 9,977,340 B2 * | 5/2018 | Aben | G03F 7/705 |
| 2005/0076316 A1 * | 4/2005 | Pierrat | G06F 17/5036 |
| | | | 716/52 |
| 2006/0290947 A1 * | 12/2006 | Li | G03F 7/70625 |
| | | | 356/625 |
| 2007/0215801 A1 * | 9/2007 | Walsh | G01B 11/0625 |
| | | | 250/252.1 |
| 2008/0088832 A1 * | 4/2008 | Cramer | G01N 21/47 |
| | | | 356/237.4 |
| 2009/0063075 A1 * | 3/2009 | Liu | G01B 11/24 |
| | | | 702/82 |
| 2009/0082993 A1 * | 3/2009 | Li | G01B 11/0625 |
| | | | 702/155 |
| 2012/0022836 A1 * | 1/2012 | Ferns | G03F 7/70625 |
| | | | 703/2 |
| 2013/0050700 A1 * | 2/2013 | Osten | G01B 11/303 |
| | | | 356/369 |
| 2013/0158948 A1 | 6/2013 | Iloreta et al. | |
| 2013/0158957 A1 | 6/2013 | Lee et al. | |
| 2015/0302241 A1 * | 10/2015 | Eineren | A01J 5/007 |
| | | | 382/110 |
| 2016/0196379 A1 * | 7/2016 | Adel | G03F 7/70625 |
| | | | 716/52 |

\* cited by examiner

AUTOMATIC SELECTION OF SAMPLE VALUES FOR OPTICAL METROLOGY

CROSS-REFERENCE TO RELATED APPLICATIONS

This application claims the benefit of U.S. Provisional Application No. 61/904,625, filed Nov. 15, 2013, the entire contents of which are hereby incorporated by reference herein.

TECHNICAL FIELD

Embodiments described herein generally relate to the field of optical metrology and, more particularly, automatic selection of sample values for optical metrology.

BACKGROUND

Optical metrology, generally regarding the process of measurement using light, includes library-based optical metrology using ellipsometers, reflectometers, or both. Library-based optical metrology includes a first phase in which a library is generated with a set of training data and a second phase in which there is measurement of the critical dimensions of a structure using optical metrology.

In optical metrology, conventional library generation methods consider the minimum and maximum of each parameter in determining the sampling range. Therefore, a multi-dimensional hypercube bound by the minimum and maximum of each parameter is used for sampling.

However, commonly there are values represented by such a hypercube are not of practical use or are not desired. For this reason, a sampling process may include a large amount of wasted time for sampling in unneeded parameter regions.

SUMMARY

Embodiments are directed to automatic selection of sample values for optical metrology.

In a first embodiment, a method includes providing a library parameter space for modeling of a diffracting structure using an optical metrology system; automatically determining by a processing unit a reduced sampling set from the library parameter space, wherein the reduced space is based on one or both of the following recommending a sampling shape based on an expected sample space usage, or recommending a sampling filter based on correlation between two or more parameters of the library parameter space; and generating a library for the optical metrology system using the reduced sampling set.

In a second embodiment, an optical metrology system includes a memory storage for storage of an optical metrology library for the system; and a processing unit to generate the library, the processing unit to: provide a library parameter space for modeling of a diffracting structure using the system, automatically determine by a processing unit a reduced sampling set from the library parameter space, wherein the reduced space is based on one or both of a recommendation of a sampling shape based on an expected sample space usage, or a recommendation of a sampling filter based on correlation between two or more parameters of the library parameter space, and generate a library for the optical metrology system using the reduced sampling set.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
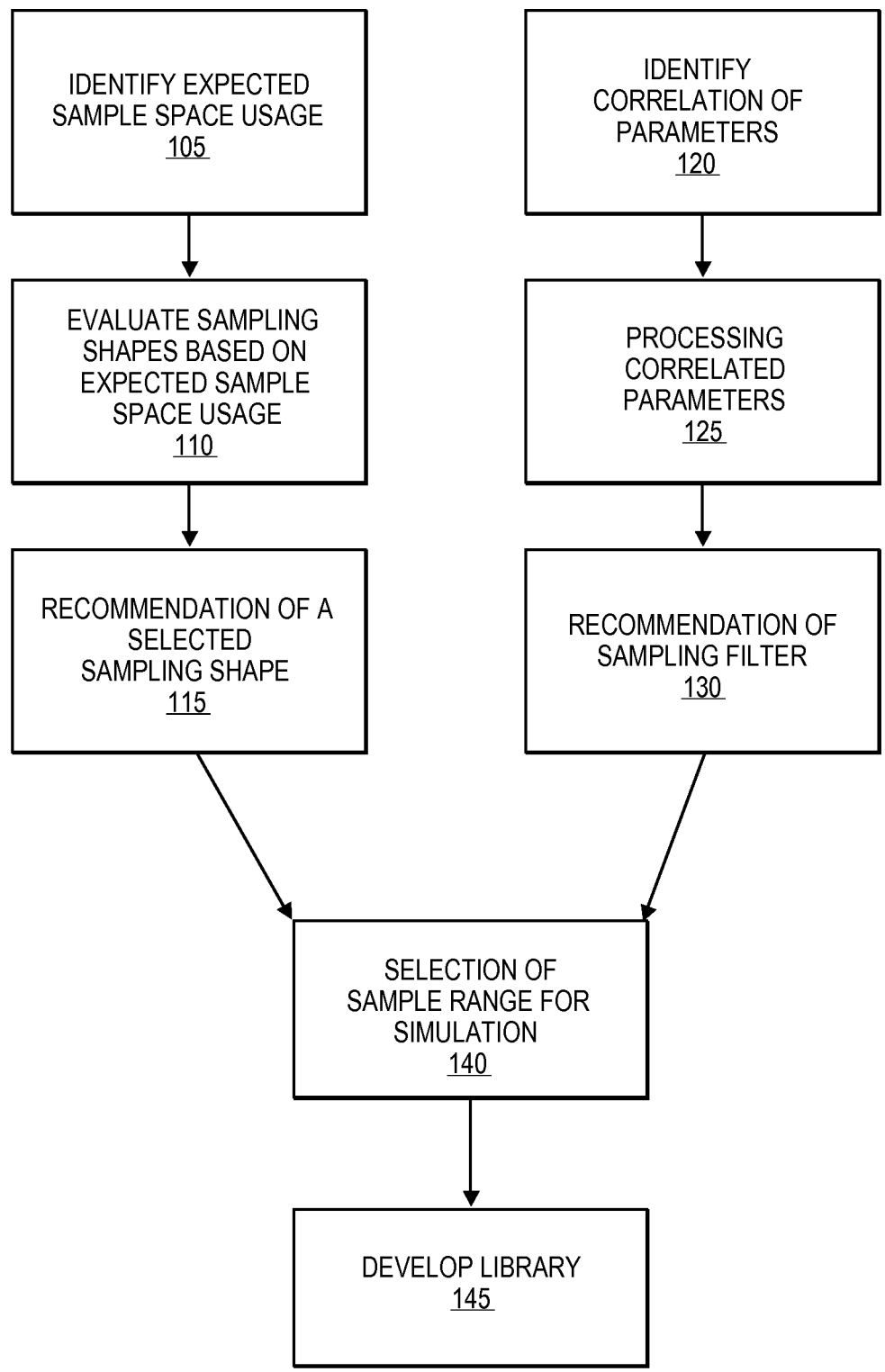
FIG. 1 is an illustration of selection of sample values for optical metrology according to an embodiment.

Embodiments described herein are generally directed to automatic selection of sample values for optical metrology, and more specifically directed to automatic recommendation of sampling shape, a sampling filter, or both for generation of a library for optical metrology.

In the following description, numerous specific details are set forth in order to provide a thorough understanding of embodiments of the present invention. It will be apparent to one skilled in the art that embodiments may be practiced without these specific details. In other instances, well-known processing operations, such as fabricating stacks of patterned material layers, are not described in detail in order to not unnecessarily obscure embodiments of the present invention. Furthermore, it is to be understood that the various embodiments shown in the figures are illustrative representations and are not necessarily drawn to scale.

In library-based optical metrology using ellipsometers, reflectometers, or both (such as single wavelength, spectroscopic, angle resolved, and multi-angle apparatuses) as a single system or any combination of these, there are in general two phases. In a first phase, a library is generated with a set of training data. The library, which is a fast mathematical approximation to the solution of an electromagnetic system given a set of values for a parametric model, is used in the second phase, which includes the process of measuring the critical dimensions of a structure using optical metrology.

Conventional library generation methods consider the minimum and maximum of each parameter in determining the sampling range. Therefore a multi-dimensional hypercube bound by the minimum and maximum of each parameter defines a sample range (or sample space) for sampling.

However, within the high-dimensional parameter space of the generated library there may be "corners" (ranges of values in the parameter space) that will not be used because such values are they are not within a customer's "Region of Interests" (ROI). The hypercube defined by the sampling range may waste a large percentage (such as up to 50% in certain circumstances) of the computation power in simulating and training the samples in the regions that will not be used in any way in the measurement process.

In some embodiments, an apparatus or system automatically recommends one or more of various sampling shapes in the populated parameter space for obtaining a set of training data in order to generate a compact yet accurate library for measuring the critical dimensions of a structure. Embodiments of an apparatus, system, or process may include usage of prior knowledge regarding the customer ROI in the populated parameter space in the process of generating a library. In some embodiments, the prior knowledge may be developed by regression testing or any other sources.

As previously stated, conventional library generation methods consider the minimum and maximum of each parameter in determining the sampling range, and therefore a multi-dimensional hypercube bound by the minimum and maximum of each parameter is used for sampling. However, in certain cases two or more floating parameters are highly correlated due to, for example, the process control, and thus for the hyperspace defined by the conventional sampling range a large percentage of the computation power in simulating and training regards the samples in the regions that will not be used in any way in the measurement process.

In some embodiments, an apparatus, system, or process provides for automatically selecting and recommending a sampling filter based upon high process correlation among a set of parameters in the populated parameter space in the process of generating a library for measuring the critical dimensions of a structure. In some embodiments, an apparatus, system, or process utilizes prior knowledge of process correlation in generating a library. This prior knowledge could come from, for example, regression testing or any other sources.

In some embodiments, an apparatus, system, or process may utilize either or both of a recommended sampling shape and a recommended sampling filter based on parameter correlation to modify the hyperspace defined by the sampling range, and thus may greatly improve efficiency of operation in generating a library for optical metrology.

In some embodiments, an apparatus, system, or process are operable with both Critical Dimension (CD) metrology, determining values for critical dimensions of a structure, and Model Overlay metrology. Critical dimensions for a feature of a structure may include, but are not limited to, values such as feature height; top, middle, and bottom feature widths; and top, middle, and bottom sidewall angles.

FIG. 1 is illustration of selection of sample values for optical metrology according to an embodiment. In some embodiments, an apparatus, system, or process for the generation of a library for optical metrology includes one or both of a recommendation of a sampling shape and a recommendation of a sampling. In some embodiments, an apparatus, system or process provides for automatically identifying an expected sample space usage 105, evaluating a plurality of possible sample shapes based on the expected sample space usage 110, and recommending a selected sampling shape 115. In some embodiments, an apparatus, system or process provides for automatically identifying correlation of two or more parameters 120, processing the correlated parameters using one or more algorithms 125, and recommending a sampling filter 130.

In some embodiments, an apparatus, system, or process utilizes one or both of the automatic recommendation of sampling shape and automatic recommendation of populated parameter space in the selection of a sample range for simulation 140 for the development of a library for optical metrology 145.

Figure 2:
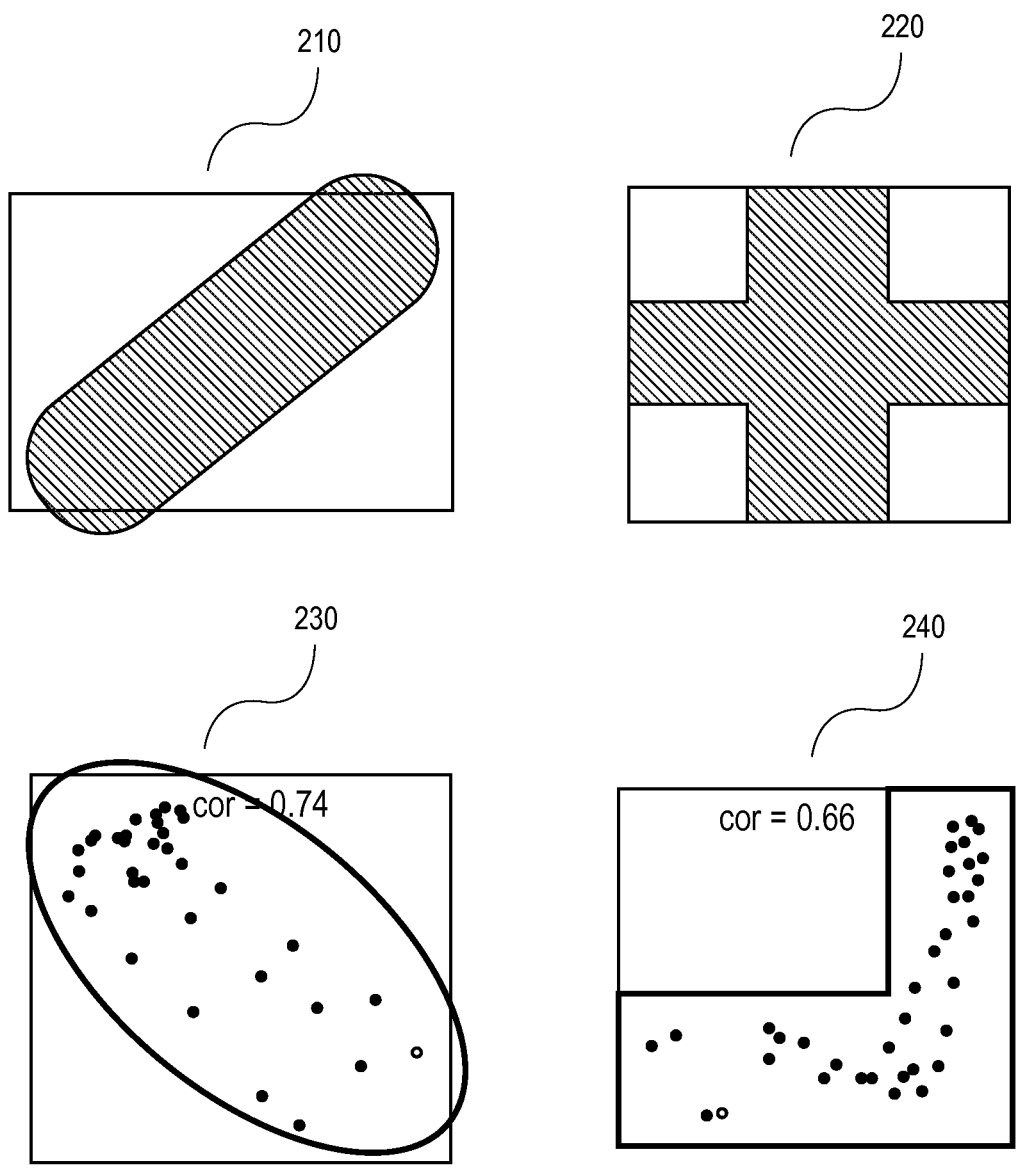
FIG. 2 is an illustration of sampling shape recommendations based on an expected sample space usage according to an embodiment.

FIG. 2 is an illustration of sampling shape recommendations based on an expected sample space usage according to an embodiment. In some embodiments, an apparatus, system, or process provides for automatically recommending a selected sampling shape of the populated parameter space. A recommended sample shape may be any shape that limits a sample range according to an expectation of unused sample space. For example, a first shape may be a rotatable customized asteroid shape 210 and a second shape be a cross shape 210. In some embodiments, the first shape 210 may be automatically recommended in response to an expected sample space usage as illustrated as the first scatter graph 230, and the second shape 220 may be automatically recommended in response to an expected sample space usage as illustrated as the second scatter graph 240. In both examples, the recommended sample space serves to address most of the expected sample space usage, where the expected sample space may be based on prior knowledge.

Figure 3:
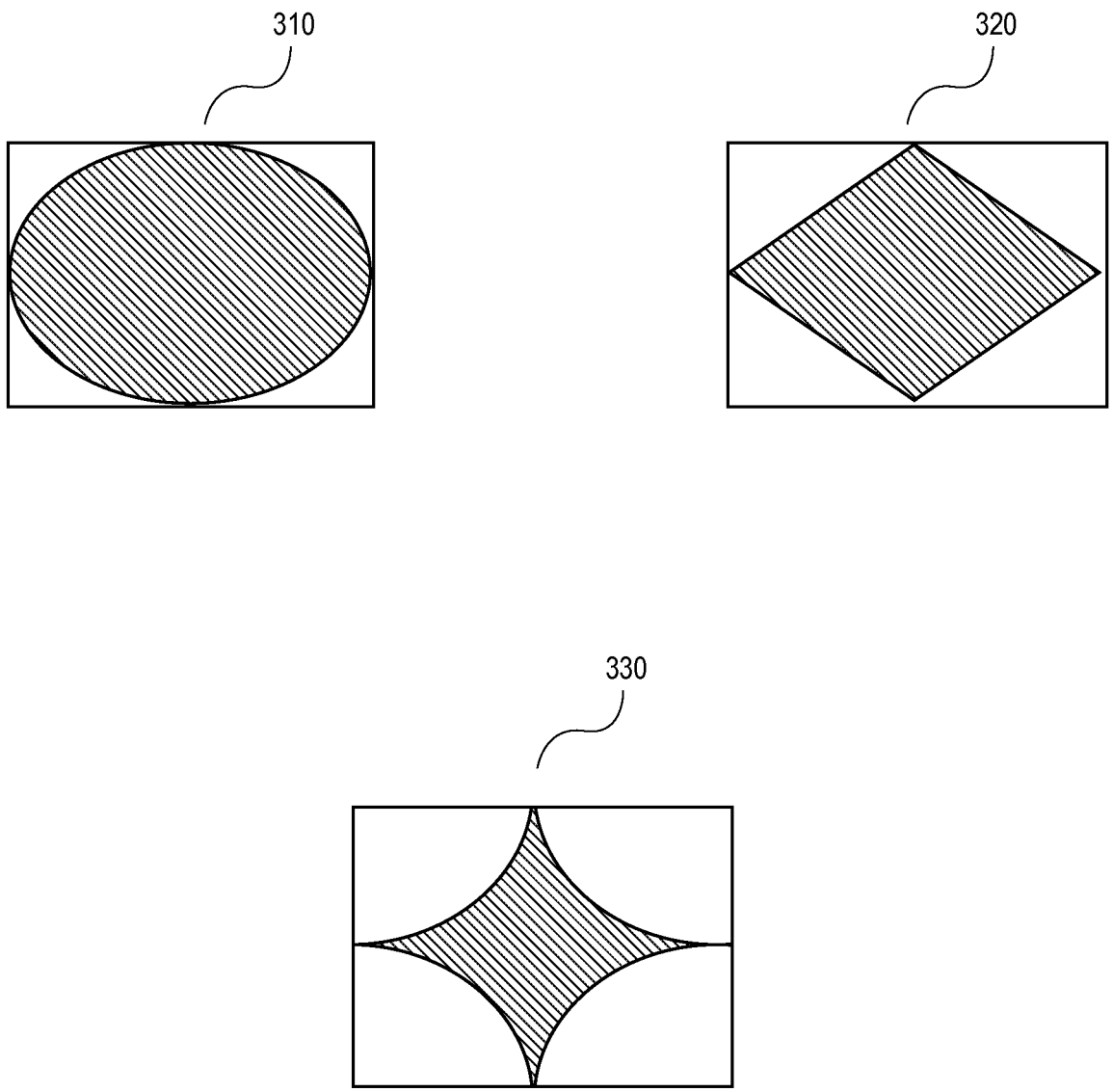
FIG. 3 illustrates additional examples of recommended sample shapes according to an embodiment.

However, embodiments are not limited to any particular recommended shape. FIG. 3 illustrates additional examples of recommended sample shapes according to an embodiment. As illustrated in FIG. 3, additional sample changes may include a third oval shape 320, a fourth diamond shape 320, and a fifth star shape 330. In some embodiments, an apparatus, system, or method may choose from a collection of multiple possible shapes, where the apparatus, system, or method may evaluate each of a set of possible sampling shapes to determine which of the sampling shapes best approximates the expected sample space usage in a particular case. Various controlling parameters can be used to control the recommended shape to fit the prior knowledge.

By recommending an appropriate sampling shape in the populated parameter space based on the prior knowledge on the process control, an apparatus, system, or process can significantly reduce the library generation time and library size while keeping a similar library quality in the region of interest. In some embodiments, the apparatus, system, or process will generate and simulate samples within the reduced region as defined by the recommended sample shape.

Figure 4:
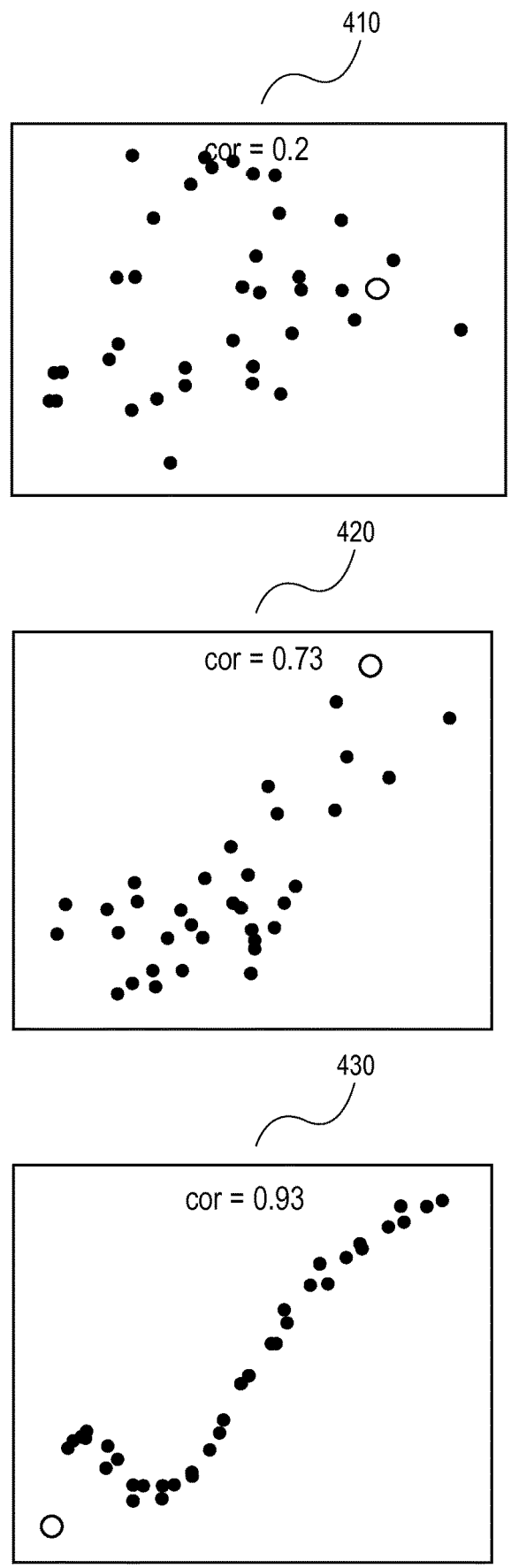
FIG. 4 is an illustration of varying parameter correlations in the generation of a sampling filter according to an embodiment.

FIG. 4 is an illustration of varying parameter correlations in the generation of a sampling filter according to an embodiment. As illustrated in FIG. 4A, a first scatter diagram 410 illustrates a process correlation with a correlation value of 0.2, a second scatter diagram 420 illustrates a process correlation with a correlation value of 0.73, and a third scatter diagram 430 illustrates a process correlation with a correlation value of 0.93. In some embodiments, a process includes evaluating correlations between parameters, which may include selecting the correlation provided in scatter diagram 430 in the generation of a sampling filter.

In a circumstance in which parameters are correlated as illustrated in scatter diagram 430, where the two illustrated parameters are highly correlated due to the process control, there is no need to simulate and train samples in the whole rectangle region. While in the illustrated example there are two correlated parameters, embodiments are not limited to any particular number of correlated parameters, as further discussed below.

Figure 5:
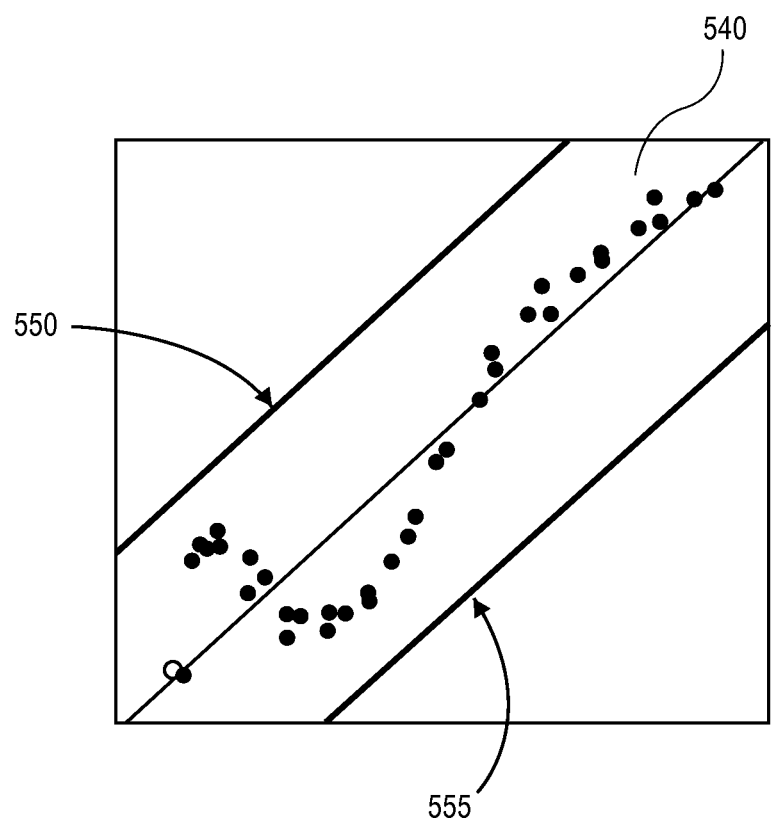
FIG. 5 is an illustration of the recommendation of a sampling filter based correlation of parameters.

FIG. 5 is an illustration of the recommendation of a sampling filter based correlation of parameters. In some embodiments, upon a determination of a particular correlation of parameters such as provided in the scatter diagram 430 reproduced on FIG. 5, an apparatus, system, or process operates to automatically recommend a reduced sample region 540 based on the correlation of parameters, wherein the sample region is reduced by a selected sampling filter, which may, for example, result in the generation of certain boundaries, such as the illustrated boundaries 550 and 555. In some embodiments, the proposed method will generate and simulate samples within the recommended reduced region defined by the sampling filter defined boundaries 550-555.

In some embodiments, the boundaries are determined based upon an algorithm to fit the correlation of the parameter space. In one implementation, a least squares based fitting may be applied to find the slope of the trend of the parameters. In some embodiments, a threshold can be used to control various algorithms to obtain a width for the slice defined in the region between the boundaries 550-555. The inner region defined by a slope and its width (between boundaries 550-555) is referred to as a sampling filter herein.

In some embodiments, with regard to parameter correlations, for libraries that have more than two parameters, an apparatus, system, or process is operable to define and calculate correlations between all the permutations of two (or more) floating parameters. In some embodiments, the apparatus, system, or process operates to sort the permutations by the absolute values of their corresponding correlation. In some embodiments, the apparatus, system, or process may automatically pick N sets with highest correlation, and cascade these sets to filter the training sample set in the generating a library. Here N could be any reasonable value. In some embodiments, a threshold for minimal acceptable correlation coefficient may be applied to control the number of sets to be chosen.

By applying a sampling filter automatically generated based on the process correlation, an apparatus, system, or process can significantly reduce the library generation time and library size while retaining a similar library quality in the region of interest.

While for ease of illustration the example provided in FIG. 5 includes automatically generating a sampling filter for two parameters in the populated parameter space where the sampling filter is generated by a least squares fitting, embodiments are not limited to such a sampling filter. In some embodiments, for generating a sampling set, by analyzing the prior knowledge an apparatus, system, or process may further:

(1) As an alternative to a cascade of two floating parameters filters, a single N-floating parameters filter may be constructed (wherein N is any value larger than 2).

(2) As an alternative to a cascade of two floating parameters filters, a cascade of N-floating parameters filter may be constructed (wherein N is any value larger than 2).

(3) As an alternative to a least squares based fitting, other algorithms may be applied to calculate a slope of the filter slice. In one example, a process may simply use the correlation coefficient.

(4) As an alternative to a linear curve in the fitting, a polynomial curve with a certain width may be used to establish the shape of the region.

(5) As an alternative to using a threshold/parameter to control the width of the slice of the parameter region, another non-parameter based algorithm may be used to calculate a width of the slice.

(6) As an alternative to linear correlation, a non-linear correlation may be used to define the sampling filter.

(7) Process correlation may be estimated with regression of representative spectra with a low quality library.

In some embodiments, method provides for automatically defining sampling shapes in generating libraries with high process correlation among the parameters in a library-based metrology with ellipsometers, reflectometers, or both (such as single wavelength, spectroscopic, angle resolved, and multi-angle apparatuses).

In some embodiments, a method of evaluating a diffracting structure includes: providing a library parameter space for modeling the diffracting structure; determining a reduced sampling set from the library parameter space based on a sampling shape; generating a library with the reduced sampling set; and determining a physical characteristic of the diffracting structure with the library.

In some embodiments, a method further includes: computing correlation of parameters in the library parameter space; and determining the sampling shape based on the correlation of the parameters.

This application incorporates by reference in its entirety for all purposes U.S. patent application Ser. No. 13/610,613, filed Sep. 11, 2012 and entitled "Library Generation With Derivatives In Optical Metrology". This application incorporates by reference in its entirety for all purposes U.S. patent application Ser. No. 13/712,734 filed Dec. 12, 2012 and entitled "Techniques for Optimized Scatterometry."

Figure 6:
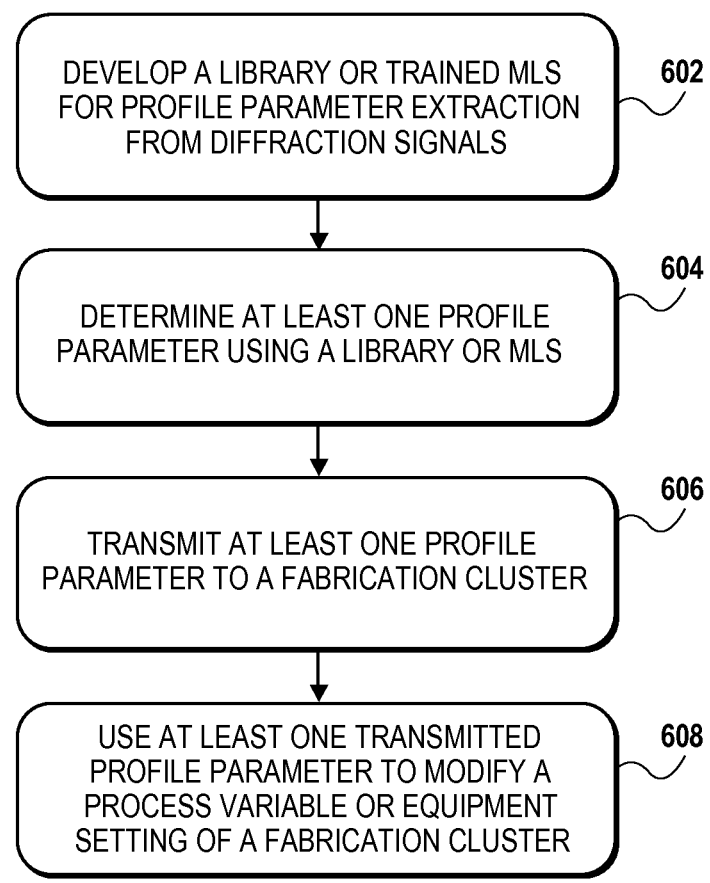
FIG. 6 depicts a flowchart representing an exemplary series of operations for determining and utilizing structural parameters for automated process and equipment control in accordance with an embodiment.

FIG. 6 depicts a flowchart 600 representing an exemplary series of operations for determining and utilizing structural parameters for automated process and equipment control in accordance with an embodiment. Referring to operation 602 of flowchart 600, a library or trained machine-learning systems (MLS) is developed to extract parameters from a set of measured diffraction signals. In operation 604, at least one parameter of a structure is determined using the library or the trained MLS. In operation 606, the at least one parameter is transmitted to a fabrication cluster configured to perform a processing operation, where the processing operation may be executed in the semiconductor manufacturing process flow either before or after measurement operation 604 is made. In operation 608, the at least one transmitted parameter is used to modify a process variable or equipment setting for the processing operation performed by the fabrication cluster.

For a more detailed description of machine-learning systems and algorithms, see U.S. Pat. No. 7,831,528, entitled "Optical Metrology Of Structures Formed On Semiconductor Wafers Using Machine Learning Systems, filed on Jun. 27, 2003, which is incorporated herein by reference in its entirety. For a description of diffraction order optimization for two-dimensional repeating structures, see U.S. Pat. No. 7,428,060, entitled Optimization Of Diffraction Order Selection For Two-Dimensional Structures, filed on Mar. 24, 2006, which is incorporated herein by reference in its entirety.

Figure 7:
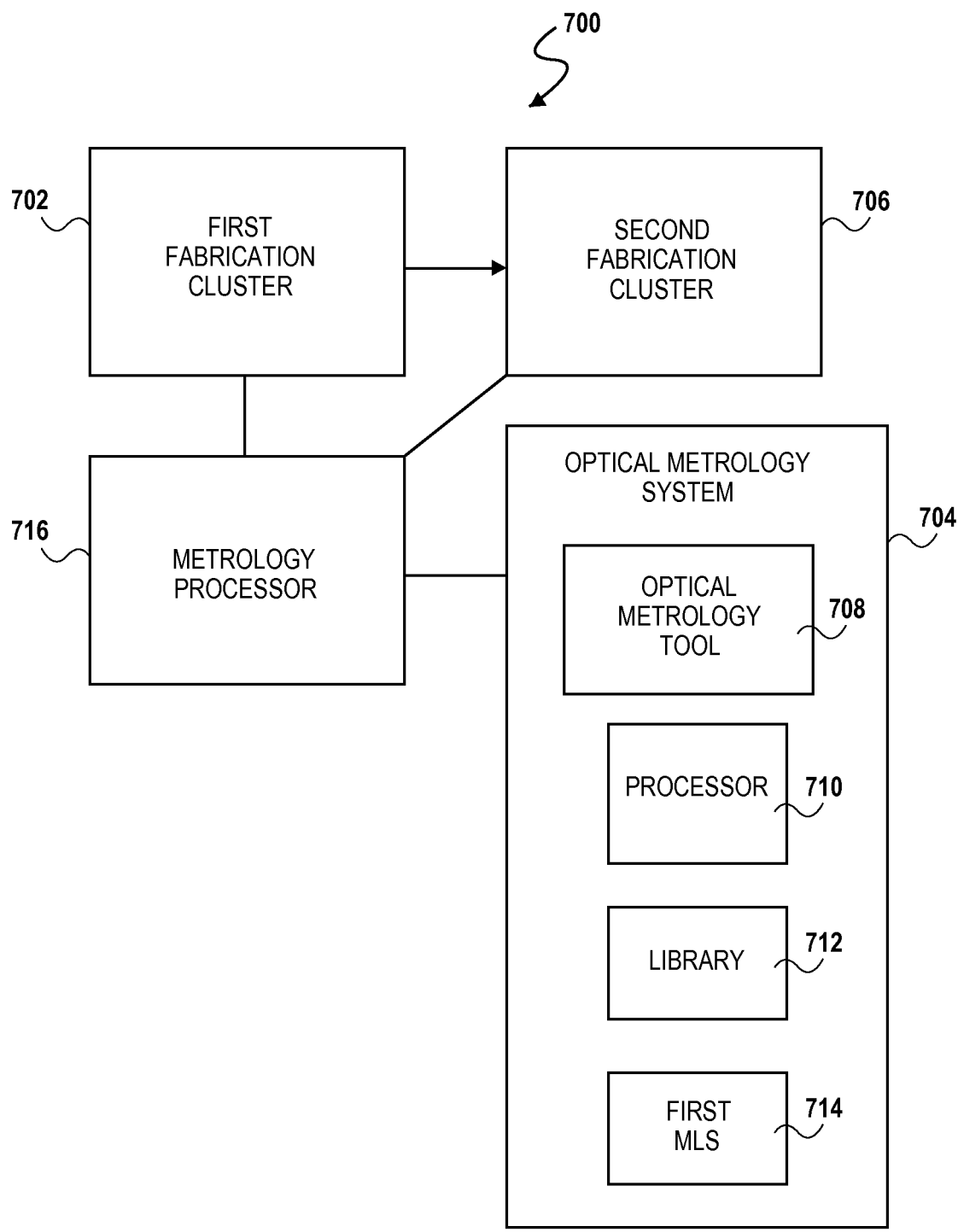
FIG. 7 is an exemplary block diagram of a system for determining and utilizing structural parameters for automated process and equipment control in accordance with an embodiment.

FIG. 7 is an exemplary block diagram of a system 700 for determining and utilizing structural parameters, such as profile or film thickness parameters, for automated process and equipment control in accordance with an embodiment. System 700 includes a first fabrication cluster 702 and optical metrology system 704. System 700 also includes a second fabrication cluster 706. Although the second fabrication cluster 706 is depicted in FIG. 7 as being subsequent to first fabrication cluster 702, it should be recognized that second fabrication cluster 706 can be located prior to first fabrication cluster 702 in system 700 (and, e.g., in the manufacturing process flow).

In one exemplary embodiment, optical metrology system 704 includes an optical metrology tool 708 and processor 710. Optical metrology tool 708 is configured to measure a diffraction signal obtained from the structure. If the measured diffraction signal and the simulated diffraction signal match, one or more values of the profile or film thickness parameters are determined to be the one or more values of the profile or film thickness parameters associated with the simulated diffraction signal.

In one exemplary embodiment, optical metrology system 704 can also include a library 712 with a plurality of simulated diffraction signals and a plurality of values of, e.g., one or more profile or film thickness parameters associated with the plurality of simulated diffraction signals. As described above, the library can be generated in advance. Processor 710 can be used to compare a measured diffraction signal obtained from a structure to the plurality of simulated diffraction signals in the library. When a matching simulated diffraction signal is found, the one or more values of the profile or film thickness parameters associated with the matching simulated diffraction signal in the library is assumed to be the one or more values of the profile or film thickness parameters used in the wafer application to fabricate the structure. In some embodiments, the processor 710 provides some or all of the processing for automatic determination of Fourier harmonic order for computation of spectral information for diffraction structures.

System 700 also includes a metrology processor 716. In one exemplary embodiment, processor 710 can transmit the one or more values of the, e.g., one or more profile or film thickness parameters to metrology processor 716. Metrology processor 716 can then adjust one or more process parameters or equipment settings of first fabrication cluster 702 based on the one or more values of the one or more profile or film thickness parameters determined using optical metrology system 704. Metrology processor 716 can also adjust one or more process parameters or equipment settings of the second fabrication cluster 706 based on the one or more values of the one or more profile or film thickness parameters determined using optical metrology system 704. As noted above, fabrication cluster 706 can process the wafer before or after fabrication cluster 702. In another exemplary embodiment, processor 710 is configured to train machine-learning system 714 using the set of measured diffraction signals as inputs to machine-learning system 714 and profile or film thickness parameters as the expected outputs of machine-learning system 714.

Figure 8A:
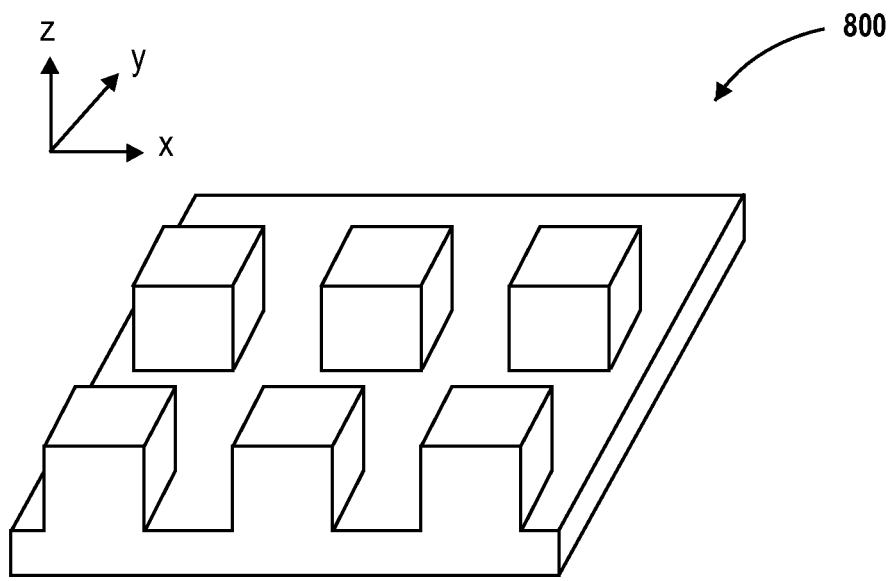
FIG. 8A depicts a periodic grating having a profile that varies in the x-y plane for modeling in accordance with an embodiment.

In an embodiment, optimizing a model of a structure includes using a three-dimensional grating structure. The term "three-dimensional grating structure" is used herein to refer to a structure having an x-y profile that varies in two horizontal dimensions in addition to a depth in the z-direction. For example, FIG. 8A depicts a periodic grating 800 having a profile that varies in the x-y plane for modeling in accordance with an embodiment. The profile of the periodic grating varies in the z-direction as a function of the x-y profile.

Figure 8B:
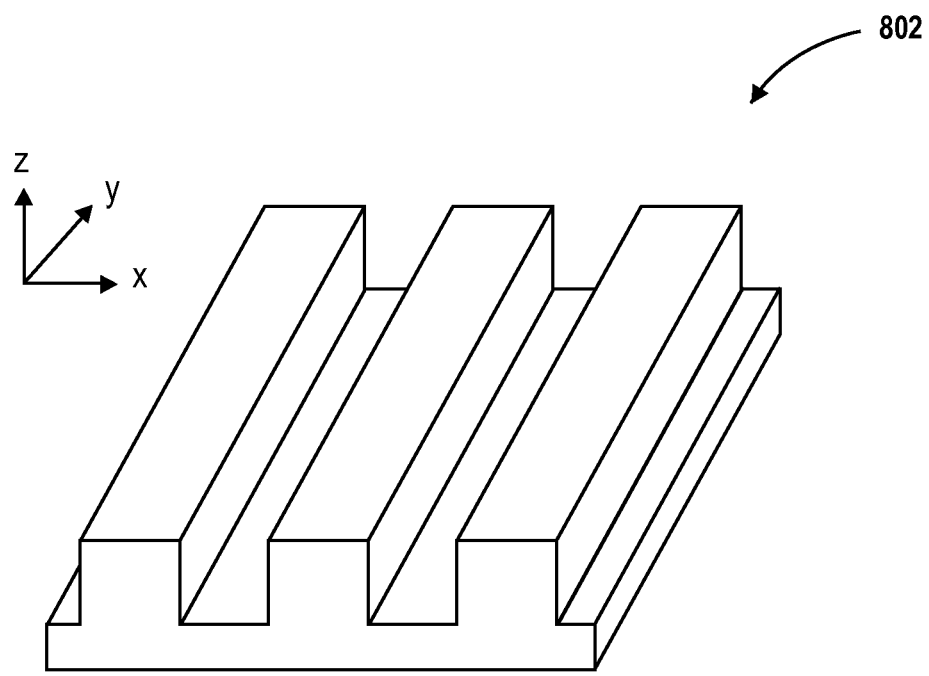
FIG. 8B depicts a periodic grating having a profile that varies in the x-direction but not in the y-direction for modeling in accordance with an embodiment.

In an embodiment, optimizing a model of a structure includes using a two-dimensional grating structure. The term "two-dimensional grating structure" is used herein to refer to a structure having an x-y profile that varies in only one horizontal dimension in addition to a depth in the z-direction. For example, FIG. 8B depicts a periodic grating 802 having a profile that varies in the x-direction but not in the y-direction for modeling in accordance with an embodiment. The profile of the periodic grating varies in the z-direction as a function of the x profile. It is to be understood that the lack of variation in the y-direction for a two-dimensional structure need not be infinite, but any breaks in the pattern are considered long range, e.g., any breaks in the pattern in the y-direction are spaced substantially further apart than the breaks in the pattern in the x-direction.

Embodiments may be suitable for a variety of film stacks. For example, in an embodiment, a method for optimizing a parameter of a critical dimension (CD) profile or structure is performed for a film stack including an insulating film, a semiconductor film and a metal film formed on a substrate. In an embodiment, the film stack includes a single layer or multiple layers. Also, in an embodiment, an analyzed or measured grating structure includes both a three-dimensional component and a two-dimensional component. For example, the efficiency of a computation based on simulated diffraction data may be optimized by taking advantage of the simpler contribution by the two-dimensional component to the overall structure and the diffraction data thereof.

Figure 9:
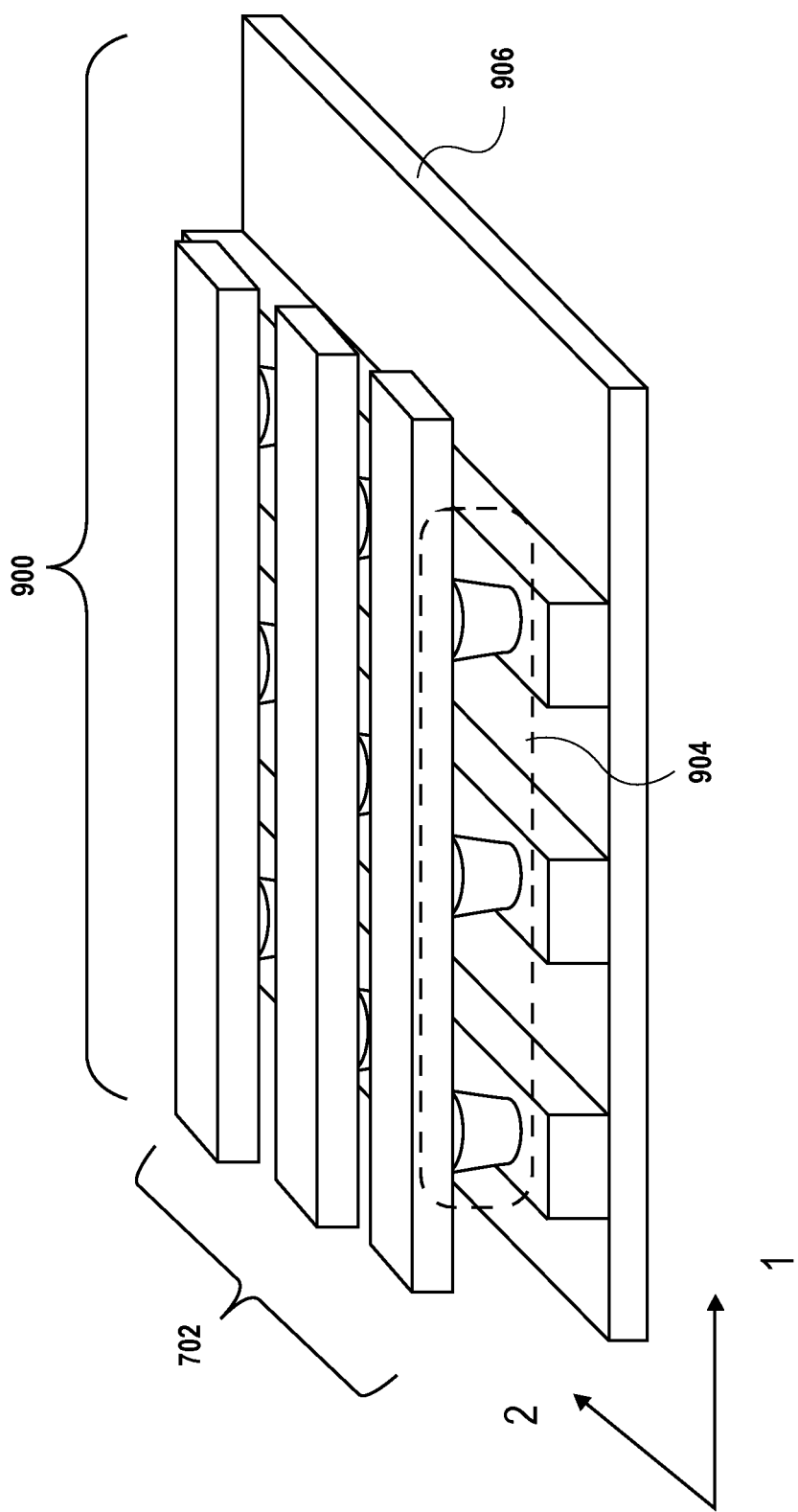
FIG. 9 represents a cross-sectional view of a structure having both a two-dimensional component and a three-dimensional component for modeling in accordance with an embodiment.

FIG. 9 represents a cross-sectional view of a structure having both a two-dimensional component and a three-dimensional component for modeling in accordance with an embodiment. Referring to FIG. 9, a structure 900 has a two-dimensional component 902 and a three-dimensional component 904 above a substrate 906. The grating of the two-dimensional component runs along direction 2, while the grating of the three-dimensional component runs along both directions 1 and 2. In one embodiment, direction 1 is orthogonal to direction 2, as depicted in FIG. 9. In another embodiment, direction 1 is non-orthogonal to direction 2.

In some embodiments, an apparatus, system, or method provides automatic determination of Fourier harmonic order for computation of spectral information for diffraction structures. In some embodiments, the measurement may include diffraction signals from a two- or three-dimensional grating structure generated by an ellipsometric optical metrology system, such as the optical metrology systems 1000 or 1150 described below in association with FIGS. 10 and 11, respectively. However, it is to be understood that the same concepts and principles equally apply to the other optical metrology systems, such as reflectometric systems. The diffraction signals represented may account for features of the two- and three-dimensional grating structure such as, but not limited to, profile, dimension, material composition, or film thickness.

Figure 10:
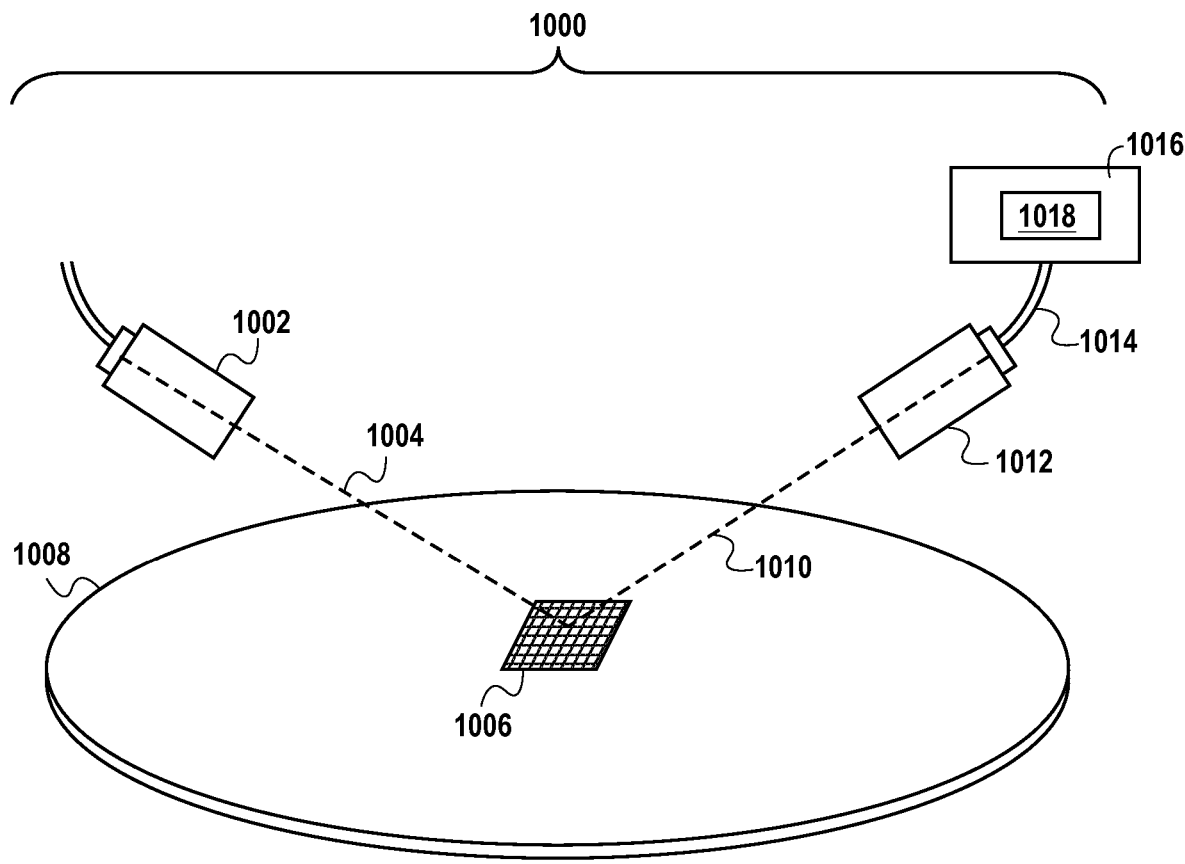
FIG. 10 is an architectural diagram illustrating the utilization of optical metrology to determine parameters of structures on a semiconductor wafer, in accordance with an embodiment.

FIG. 10 is an architectural diagram illustrating the utilization of optical metrology to determine parameters of structures on a semiconductor wafer, in accordance with an embodiment. The optical metrology system 1000 includes a metrology beam source 1002 projecting an incident metrology beam 1004 at the target structure 1006 of a wafer 1008. The incident metrology beam 1004 is projected at an incidence angle θ towards the target structure 1006 (θ is the angle between the incident metrology beam 1004 and a normal to the target structure 1006). The ellipsometer may, in one embodiment, use an incidence angle of approximately 60° to 70°, or may use a lower angle (possibly close to 0° or near-normal incidence) or an angle greater than 70° (grazing incidence). The diffraction beam 1010 is measured by a metrology beam receiver 1012. The diffraction beam data 1014 is transmitted to a profile application server 1016. The profile application server 1016 may compare the measured diffraction beam data 1014 against a library 1018 of simulated diffraction beam data representing varying combinations of critical dimensions of the target structure and resolution.

In one exemplary embodiment, the library 1018 instance best matching the measured diffraction beam data 1014 is selected. It is to be understood that although a library of diffraction spectra or signals and associated hypothetical profiles or other parameters is frequently used to illustrate concepts and principles, embodiments may apply equally to a data space including simulated diffraction signals and associated sets of profile parameters, such as in regression, neural network, and similar methods used for profile extraction. The hypothetical profile and associated critical dimensions of the selected library 1018 instance is assumed to correspond to the actual cross-sectional profile and critical dimensions of the features of the target structure 1006. The optical metrology system 1000 may utilize a reflectometer, an ellipsometer, or other optical metrology device to measure the diffraction beam or signal.

In order to facilitate the description of embodiments, an ellipsometric optical metrology system is used to illustrate the above concepts and principles. It is to be understood that the same concepts and principles apply equally to the other optical metrology systems, such as reflectometric systems. In an embodiment, the optical scatterometry is a technique such as, but not limited to, optical spectroscopic ellipsometry (SE), beam-profile reflectometry (BPR), beam-profile ellipsometry (BPE), and ultra-violet reflectometry (UVR). In a similar manner, a semiconductor wafer may be utilized to illustrate an application of the concept. Again, the methods and processes apply equally to other work pieces that have repeating structures.

Figure 11:
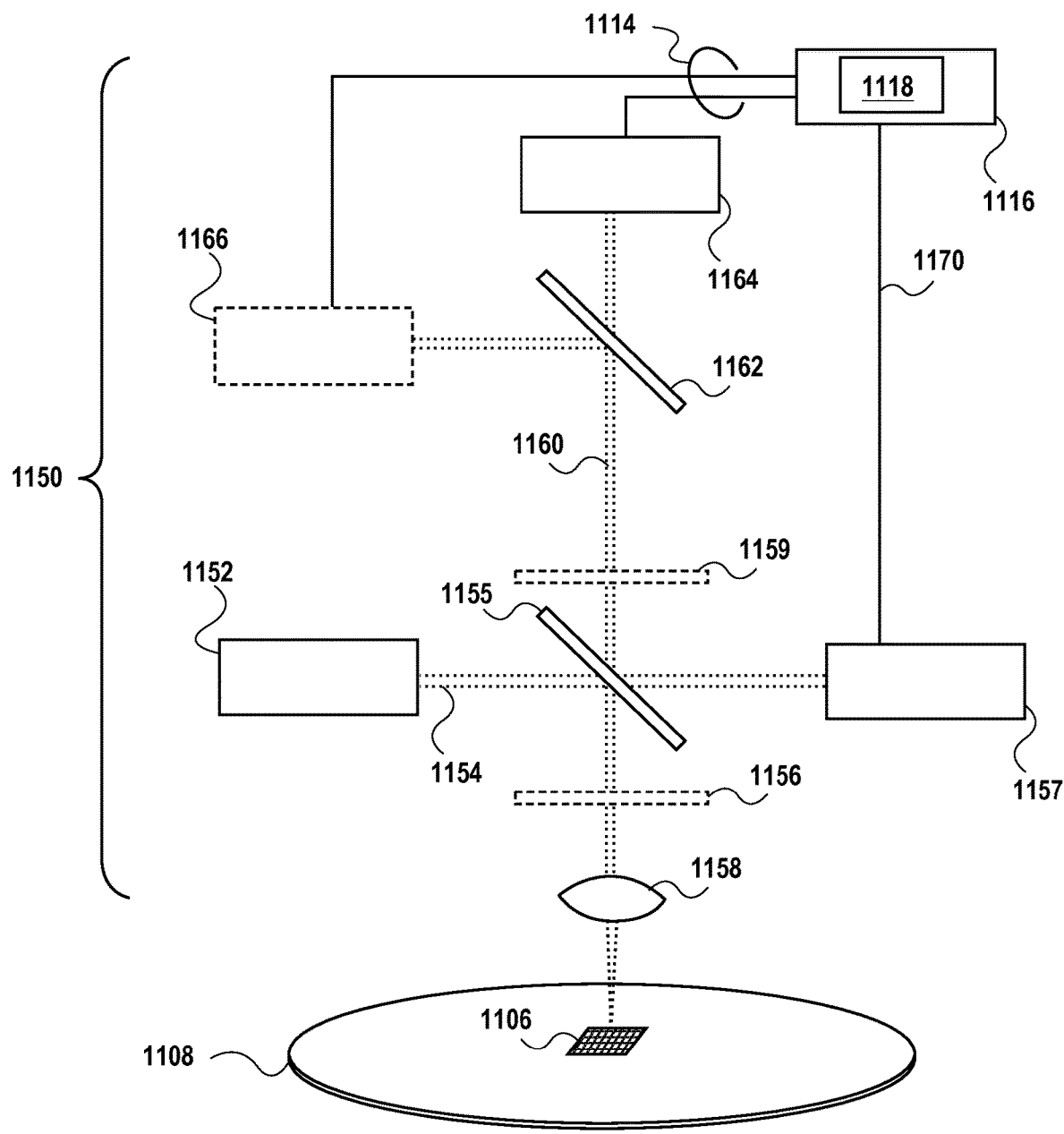
FIG. 11 is an architectural diagram illustrating the utilization of beam-profile reflectometry, beam-profile ellipsometry, or both to determine parameters of structures on a semiconductor wafer in accordance with an embodiment.

FIG. 11 is an architectural diagram illustrating the utilization of beam-profile reflectometry, beam-profile ellipsometry, or both to determine parameters of structures on a semiconductor wafer in accordance with an embodiment. The optical metrology system 1150 includes a metrology beam source 1152 generating a polarized metrology beam 1154. Preferably this metrology beam has a narrow bandwidth of 10 nanometers or less. In some embodiments, the metrology beam source 1152 is capable of outputting beams of different wavelengths by switching filters or by switching between different lasers or super-bright light emitting diodes. Part of this beam is reflected from the beam splitter 1155 and focused onto the target structure 1106 of a wafer 1108 by objective lens 1158, which has a high numerical aperture (NA), preferably an NA of approximately 0.9 or 0.95. The portion of the polarized metrology beam 1154 that is not reflected from the beam splitter is directed to beam intensity monitor 1157. The metrology beam may, optionally, pass through a quarter-wave plate 1156 before the objective lens 1158.

After reflection from the target the reflected beam 1160 passes back through the objective lens and is directed to one or more detectors. If optional quarter-wave plate 1156 is present, the beam will pass back through that quarter-wave plate before being transmitted through the beam splitter 1155. After the beam-splitter, the reflected beam 1160 may optionally pass through a quarter-wave plate at location 1159 as an alternative to location 1156. If the quarter-wave plate is present at location 1156, it will modify both the incident and reflected beams. If it is present at location 1159, it will modify only the reflected beam. In some embodiments, no wave plate may be present at either location, or the wave plate may be switched in and out depending on the measurement to be made. It is to be understood that in some embodiments it might be desirable that the wave plate have a retardance substantially different from a quarter wave, i.e. the retardance value might be substantially greater than, or substantially less than, 90°.

A polarizer or polarizing beam splitter 1162 directs one polarization state of the reflected beam 1160 to detector 1164, and, optionally, directs a different polarization state to an optional second detector 1166. The detectors 1164 and 1166 might be one-dimensional (line) or two-dimensional (array) detectors. Each element of a detector corresponds to a different combination of AOI and azimuthal angles for the corresponding ray reflected from the target. The diffraction beam data 1114 from the detector(s) is transmitted to the profile application server 1116 along with beam intensity data 1170. The profile application server 1116 may compare the measured diffraction beam data 1114 after normalization or correction by the beam intensity data 1170 against a library 1118 of simulated diffraction beam data representing varying combinations of critical dimensions of the target structure and resolution.

For more detailed descriptions of systems that could be used to measure the diffraction beam data or signals for use with embodiments, see U.S. Pat. No. 6,734,967, entitled "Focused Beam Spectroscopic Ellipsometry Method And System", filed on Feb. 11, 1999, and U.S. Pat. No. 6,278,519 entitled "Apparatus For Analyzing Multi-Layer Thin Film Stacks On Semiconductors", filed Jan. 29, 1998, both of which are incorporated herein by reference in their entirety. These two patents describe metrology systems that may be configured with multiple measurement subsystems, including one or more of a spectroscopic ellipsometer, a single-wavelength ellipsometer, a broadband reflectometer, a DUV reflectometer, a beam-profile reflectometer, and a beam-profile ellipsometer. These measurement subsystems may be used individually, or in combination, to measure the reflected or diffracted beam from films and patterned structures. The signals collected in these measurements may be analyzed to determine parameters of structures on a semiconductor wafer in accordance with embodiments.

Embodiments may be provided as a computer program product, or software, that may include a machine-readable medium having stored thereon instructions, which may be used to program a computer system (or other electronic devices) to perform a process according an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
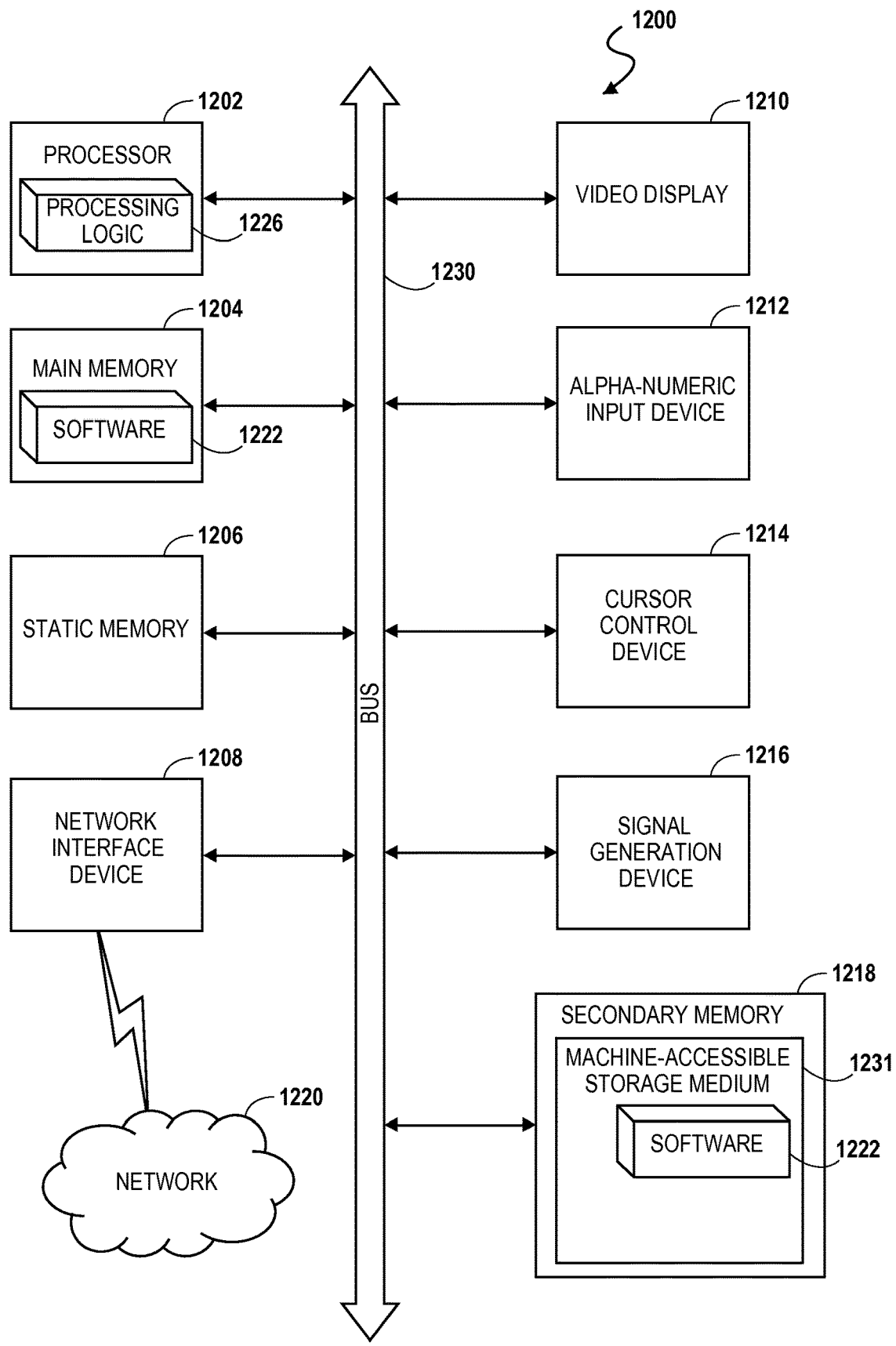
FIG. 12 illustrates a block diagram of a machine in the exemplary form of a computer system in accordance with an embodiment.

FIG. 12 illustrates a block diagram of a machine in the exemplary form of a computer system in accordance with an embodiment within which a set of instructions, for causing the computer to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230. In some embodiments, one or more of the memories are used for storage of data for automatic determination of Fourier harmonic order for computation of spectral information for diffraction structures.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations discussed herein. In some embodiments, processor 1202 provides some or all of the processing for automatic determination of Fourier harmonic order for computation of spectral information for diffraction structures.

The computer system 1200 may further include a network interface device 1208. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1231 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1231 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In some embodiments, a machine-accessible storage medium includes instructions stored thereon that cause a data processing system to perform automatic determination of Fourier harmonic order for computation of spectral information for diffraction structures.

It is to be understood that the above methodologies may be applied under a variety of circumstances within the spirit and scope of embodiments. For example, in an embodiment, measurements described above are performed with or without the presence of background light. In an embodiment, a method described above is performed in a semiconductor, solar, light-emitting diode (LED), or a related fabrication process. In an embodiment, a method described above is used in a stand-alone or an integrated metrology tool.

Figure 13:
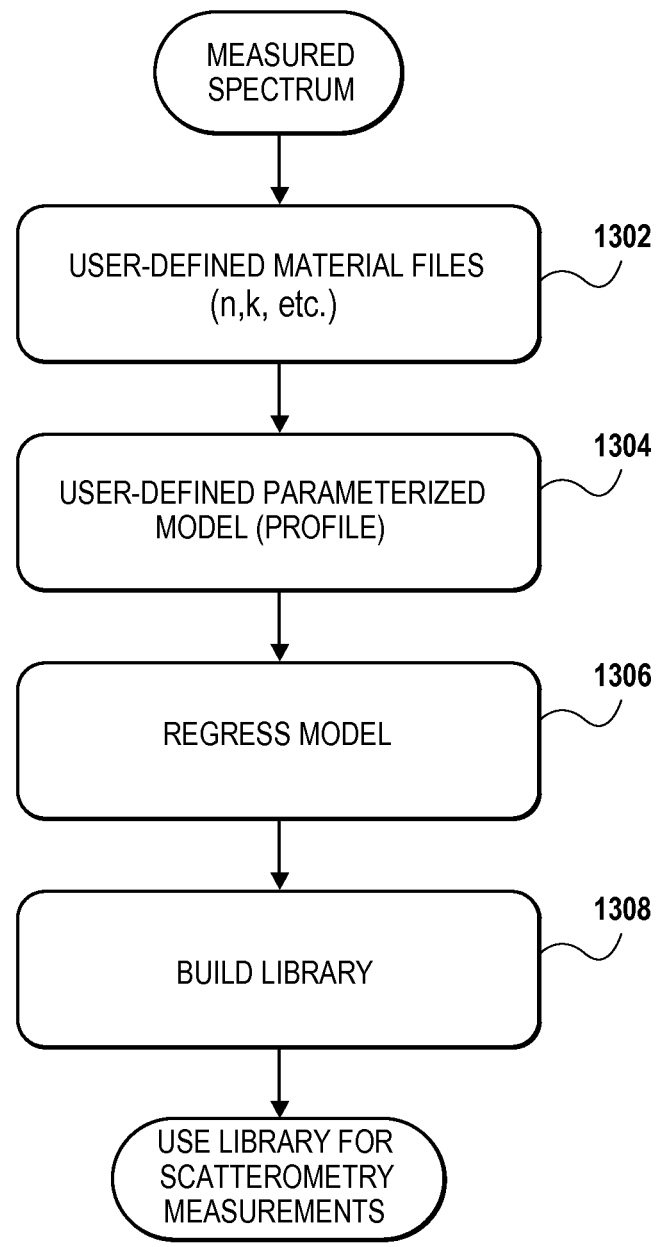
FIG. 13 is a flowchart representing operations in a method for a building parameterized model and a spectral library beginning with sample spectra in accordance with an embodiment.

Analysis of measured spectra generally involves comparing the measured sample spectra to simulated spectra to deduce parameter values of a model that best describe the measured sample. FIG. 13 is a flowchart 1300 representing operations in a method for a building a parameterized model and a spectral library beginning with sample spectra (e.g., originating from one or more work pieces) in accordance with an embodiment.

At operation 1302, a set of material files are defined by a user to specify characteristics (e.g., refractive index or n, k values) of the material(s) from which the measured sample feature is formed.

At operation 1304, a scatterometry user defines a nominal model of the expected sample structure by selecting one or more of the material files to assemble a stack of materials corresponding to those present in the periodic grating features to be measured. Such a user-defined model may be further parameterized through definition of nominal values of model parameters, such as thicknesses, critical dimension (CD), sidewall angle (SWA), height (HT), edge roughness, corner rounding radius, etc. which characterize the shape of the feature being measured. Depending on whether a two-dimensional model (i.e., a profile) or three-dimensional model is defined, it is not uncommon to have 30-50, or more, such model parameters.

From a parameterized model, simulated spectra for a given set of grating parameter values may be computed using rigorous diffraction modeling algorithms, such as Rigorous Coupled Wave Analysis (RCWA). Regression analysis is then performed at operation 1306 until the parameterized model converges on a set of parameter values characterizing a final profile model (for two-dimensional) that corresponds to a simulated spectrum which matches the measured diffraction spectra to a predefined matching criterion. The final profile model associated with the matching simulated diffraction signal is presumed to represent the actual profile of the structure from which the model was generated.

The matching simulated spectra and/or associated optimized profile model can then be utilized at operation 1308 to build a library of simulated diffraction spectra by perturbing the values of the parameterized final profile model. The resulting library of simulated diffraction spectra may then be employed by a scatterometry measurement system operating in a production environment to determine whether subsequently measured grating structures have been fabricated according to specifications. Library generation 1308 may include a machine-learning system, such as a neural network, generating simulated spectral information for each of a number of profiles, each profile including a set of one or more modeled profile parameters. In order to generate the library, the machine-learning system itself may have to undergo some training based on a training dataset of spectral information. Such training may be computationally intensive and/or may have to be repeated for different models and/or profile parameter domains. Considerable inefficiency in the computational load of generating a library may be introduced by a user's decisions regarding the size of a training dataset. For example, selection of an overly large training dataset may result in unnecessary computations for training while training with a training dataset of insufficient size may necessitate a retraining to generate a library.

For some applications it may be unnecessary to build a library. After the parametric model of the structure has been created and optimized, a regression analysis similar to that described above may be used in real time to determine the best fitting parameter values for each target as the diffraction beam data are collected. If the structure is relatively simple (for example, a 2D (two-dimensional) structure), or if only a small number of parameters need to be measured, regression may be fast enough even though it may be slower than using a library. In other cases, the extra flexibility of using regression may justify some increase in measurement time over using a library. For a more detailed description of methods and systems that are capable of real-time regression of OCD data for use with an embodiment, see U.S. Pat. No. 7,031,848, entitled "Real Time Analysis Of Periodic Structures On Semiconductors", filed on Jul. 8, 2005, which is incorporated herein by reference in its entirety.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. A method comprising:
providing a first library parameter space comprising a populated parameter space of a plurality of parameters for modeling of a diffracting structure using an optical metrology system;
automatically reducing, by a processing unit, the populated parameter space to produce a second library parameter space comprising a reduced populated parameter space of the plurality of parameters, wherein the reduction of the populated parameter space is based on the following:
recommending a sampling filter that includes 1) identifying correlations between two or more parameters of the plurality of parameters, 2) processing the correlated parameters using one or more algorithms, and 3) comparing such correlations;
generating a parameterized model of the diffracting structure based on the plurality of parameters; and
generating a library for the optical metrology system using the generated parameterized model of the diffracting structure and the second library parameter space, while not using a portion of the populated parameter space that is excluded from the reduced populated parameter space,
wherein the first library parameter space and the second library parameter space are composed of a same plurality of dimensions, each dimension associated with a different parameter of the plurality of parameters.

2. The method of claim 1, further comprising determining a physical characteristic of the diffracting structure with the library.

3. The method of claim 1, wherein the expected sample space use is based at least in part upon prior knowledge of a customer's region of interest.

4. The method of claim 1, wherein the reduction of the populated parameter space is further based on recommending a sampling shape based on an expected sample space usage, wherein recommending the sampling shape comprises automatically choosing a collection of multiple possible shapes and evaluating each of a set of possible sampling shapes from the collection to determine a best fit for the expected sample space use.

5. The method of claim 1, wherein the sampling filter includes a region defined by a certain slope and a certain width.

6. The method of claim 5, wherein the one or more algorithms include a least squares fitting to determine the slope of the region of the sample filter.

7. The method of claim 1, wherein the processing of the correlated parameters is based at least in part on prior knowledge of parameter correlation.

8. The method of claim 1, wherein the optical metrology system includes one or more of a spectroscopic or angle-resolved ellipsometer or spectroscopic or angle-resolved reflectometer.

9. The method of claim 1, wherein automatically reducing, by the processing unit, the populated parameter space of the first library parameter space comprises limiting a sampling range of the plurality of parameters in the first library parameter space by either the sampling shape or the sampling filter.

10. An optical metrology system comprising:
a memory storage for storage of an optical metrology library for the system; and
a processing unit to:
provide a first library parameter space comprising a populated parameter space of a plurality of parameters for modeling of a diffracting structure using the system,
automatically reduce, by a processing unit, the populated parameter space to produce a second library parameter space comprising a reduced populated parameter space of the plurality of parameters, wherein the reduction of the populated parameter space is based on the following:
a recommendation of a sampling filter that includes 1) identifying correlations between two or more parameters of the plurality of parameters, 2) processing the correlated parameters using one or more algorithms, and 3) comparing such correlations,
generate a parametrized model of the diffracting structure based on the plurality of parameters; and
generate a library for the optical metrology system using the generated parameterized model of the diffracting structure and the second library parameter-dimensional space, while not using a portion of the populated parameter space that is excluded from the reduced populated parameter space,
wherein the first library parameter space and the second library parameter space are composed of a same plurality of dimensions, each dimension associated with a different parameter of the plurality of parameters.

11. The system of claim 10, wherein the system includes one or more of a spectroscopic or angle-resolved ellipsometer or spectroscopic or angle-resolved reflectometer.

12. The system of claim 10, wherein the system is further to determine a physical characteristic of the diffracting structure with the library.

13. The system of claim 10, wherein the expected sample space use is based at least in part upon prior knowledge of a customer's region of interest.

14. The system of claim 10, wherein the reduction of the populated parameter space is further based on a recommendation of a sampling shape based on an expected sample space usage, wherein recommending the sampling shape comprises automatically choosing a collection of multiple possible shapes stored in the memory storage and evaluating each of a set of possible sampling shapes from the collection to determine a best fit for the expected sample space use.

15. The system of claim 10, wherein the sampling filter includes a region defined by a certain slope and a certain width.

16. The system of claim 15, wherein the one or more algorithms include a least squares fitting to determine the slope of the region of the sample filter.

17. The system of claim 10, wherein the processing of the correlated parameters is based at least in part on prior knowledge of parameter correlation.

18. A non-transitory computer-readable storage medium having stored thereon data representing sequences of instructions that, when executed by a processor, cause the processor to perform operations comprising:
providing a first library parameter space comprising a populated parameter space of a plurality of parameters for modeling of a diffracting structure using an optical metrology system;
automatically reducing, by a processing unit, the populated parameter space to produce a second library parameter space comprising a reduced populated parameter space of the plurality of parameters, wherein the reduction of the populated parameter space is based on the following:

recommending a sampling filter that includes 1) identifying correlations between two or more parameters of the plurality of parameters, 2) processing the correlated parameters using one or more algorithms, and 3) comparing such correlations; and generating a parameterized model of the diffracting structure based on the plurality of parameters;

generating a library for the optical metrology system using the generated parameterized model of the diffracting structure and the second library parameter space, while not using a portion of the populated parameter space that is excluded from the reduced populated parameter space, wherein the first library parameter space and the second library parameter space are composed of a same plurality of dimensions, each dimension associated with a different parameter of the plurality of parameters.

19. The medium of claim 18, further comprising instructions that, when executed by the processor, cause the processor to perform operations comprising:

determining a physical characteristic of the diffracting structure with the library.

20. The medium of claim 18, wherein the expected sample space use is based at least in part upon prior knowledge of a customer's region of interest.

21. The medium of claim 18, wherein the sampling filter includes a region defined by a certain slope and a certain width.

22. The medium of claim 21, wherein the one or more algorithms include a least squares fitting to determine the slope of the region of the sample filter.

23. The medium of claim 18, wherein the processing the correlated parameters is based at least in part on prior knowledge of parameter correlation.

24. The medium of claim 18, wherein the reduction of the populated parameter space is further based on recommending a sampling shape based on an expected sample space usage, wherein recommending the sampling shape comprises automatically choosing a collection of multiple possible shapes and evaluating each of a set of possible sampling shapes from the collection to determine a best fit for the expected sample space use.

* * * * *